United States Patent [19]

Luce et al.

[11] 3,912,558

[45] Oct. 14, 1975

[54] METHOD OF MOS CIRCUIT FABRICATION

[75] Inventors: Robert L. Luce, Los Altos Hills; Joseph P. Perry, Sunnyvale; James D. Sansbury, Palo Alto, all of Calif.

[73] Assignee: Fairchild Camera and Instrument Corporation, Mountain View, Calif.

[22] Filed: May 3, 1974

[21] Appl. No.: 466,566

[52] U.S. Cl. ................ 148/187; 117/212; 148/188; 156/3

[51] Int. Cl.²........................................ H01L 21/225

[58] Field of Search..................... 148/187, 188, 1.5; 117/212; 156/3

[56] References Cited

UNITED STATES PATENTS

| | | | |
|---|---|---|---|
| 3,476,619 | 11/1969 | Tolliver | 148/187 |
| 3,756,876 | 9/1973 | Brown et al. | 148/187 X |
| 3,825,442 | 7/1974 | Moore | 148/187 UX |
| 3,850,708 | 11/1974 | Imaizumi et al. | 148/187 |

*Primary Examiner*—L. Dewayne Rutledge
*Assistant Examiner*—J. M. Davis
*Attorney, Agent, or Firm*—Alan H. MacPherson

[57] ABSTRACT

An improved method of MOS circuit fabrication includes: formation of a region of first selected material on the surface of underlying material, removal of less than all of the first selected material from selected regions of the underlying material, formation of a layer of insulating material between the first selected material and the underlying material, conversion of the first selected material to a second selected material, and removal of the second selected material to expose selected regions of the underlying material. In one embodiment the first selected material is an oxide of boron, while the second selected material is an oxide of phosphorous.

11 Claims, 4 Drawing Figures

METHOD OF MOS CIRCUIT FABRICATION

BACKGROUND OF THE INVENTION

1. Field of the Invention

This invention relates to fabrication of MOS circuits, and specifically to fabrication of MOS circuits by the isoplanar process as described in the U.S. Pat. No. 3648125, entitled "Method of Fabricating Integrated Circuits with Oxide Insulation and the Resulting Structure", issued Mar. 7, 1972, to Fairchild Camera and Instrument Corporation.

2. Description of the Prior Art

Conventional techniques for the fabrication of silicon gate integrated circuit structures typically involve the use of boron to form p+ regions in a monocrystalline silicon substrate. In one well-known process, a polycrystalline silicon island is formed on the surface of a region of thin silicon dioxide which has previously been formed on a substrate of monocrystalline silicon. The oxide overlying selected regions of the substrate wherein source or drain regions are desired is removed and boron oxide deposited. In many prior art processes these selected regions are chosen to be adjacent to the polycrystalline or polysilicon island. P+ conductivity type source or drain regions are formed where the boron diffuses into the silicon substrate. Conventionally the boron oxide is removed and a region of insulating material is formed for masking and etching of openings for electrical contact. Subsequently, electrical connections are made to desired regions through these openings.

Unfortunately, this procedure by which many prior art MOS circuits have been fabricated includes a number of deficiencies. First, it is difficult to obtain highly reliable electrical connections using metal deposited on the surface of the wafer. The principal reasons for this difficulty appear to be the abrupt edges of the polycrystalline silicon islands and the intersection of the thin gate oxide with the substantially thicker field oxide over which the metal connections must be formed. The abrupt change of direction which the deposited metal is required to assume causes cracks and gaps within the metal. Consequently, it is difficult to create a reliable electrical connection in a substantial number of structures. It is also difficult to form reliable electrical connections between the metal and polycrystalline silicon, and between the metal and source or drain regions. This difficulty is also apparently caused by the sharp edge of the opening in the oxide which the metal traverses.

Additionally, MOS circuits constructed in accordance with the prior art were susceptible to "staining" of the heavily doped source and drain region contact openings. Staining is a phenomenon well known in the art of semiconductor manufacture. The result of staining is to cause nonuniform, unpredictable penetration of the source or drain regions during formation of the metal connections with these regions.

Further, in the processes of some prior art semiconductor fabrication, the boron diffusion process and subsequent oxidations cause the creation of a thin layer of boron oxide on the p+ source or drain region surfaces beneath subsequently formed phosphorous oxide. Whereas the phosphorous oxide etches very rapidily, the boron oxide etches very slowly. Consequently, extended etching times are necessary to completely remove the boron oxide, especially the last approximately 200 Angstroms. The prolonged etch times necessary to remove the boron oxide cause excessive etching of other closely situated oxides and result in openings in the phosphorous oxide for electrical connections which are undesirably large, and which have excessively steep walls. These steep walls are prominent even though the oxide etches at a higher rate at the surface, than in the interior.

In addition, the p+ region silicon surface tends to remain hydrophilic, even though the oxide is removed. Oxidized silicon is known to be hydrophilic, while silicon is hydrophobic. Because the transition from hydrophilic to hydrophobic is often used as a test of the completeness of an etching process, it is difficult to discern when sufficient etching has occurred. Further, if the slow etching boron oxide region is not completely removed, it is difficult to alloy metal electrical contact to the p+ source or drain regions.

SUMMARY OF THE INVENTION

The invention described herein circumvents the above discussed difficulties. This invention provides a structure which does not depend upon creating a structure with a continuously decreasing etch rate for producing a continuously contoured oxide edge around an opening made for electrical contact. The smoothly contoured oxide edges are obtained by thermal processing after providing openings to the source or drain region surfaces. The contoured edges assist in assuring a reliable metal to silicon electrical connection. This invention also provides greater control over the size of an opening for an electrical connection to an underlying region and a more reliable etching process to expose these underlying regions. Additionally, the invention provides an indicator for completion of the etching process because the exposed silicon will be hydrophobic.

According to this invention, a first selected material if formed adjacent to and in contact with a surface of a semiconductor substrate. All, or substantially all, of the first selected material is removed from selected regions of the substrate surface. These selected regions can be at locations where electrical contact to the source region, the drain region, or another region is desired. A region of first insulating material is then formed on the previously underlying substrate. If any of the first selected material remains on the substrate, the first insulating material will separate the first selected material from the substrate. A region of second insulating material is then formed on the surface of the wafer, and subjected to heat treatment. Openings for electrical connections are made, and a second heat treatment is performed. During this second heat treatment process step, insulating material formed on the exposed surfaces of the substrate is converted to a second selected material and removed. Electrical connections are then provided.

DESCRIPTION OF THE PREFERRED EMBODIMENTS

One embodiment of the process of this invention will be discussed with relationship to FIGS. 1_a_ to 1_d_. Referring now to FIG. 1_a_, a layer of insulating material 11

Figure 1A:
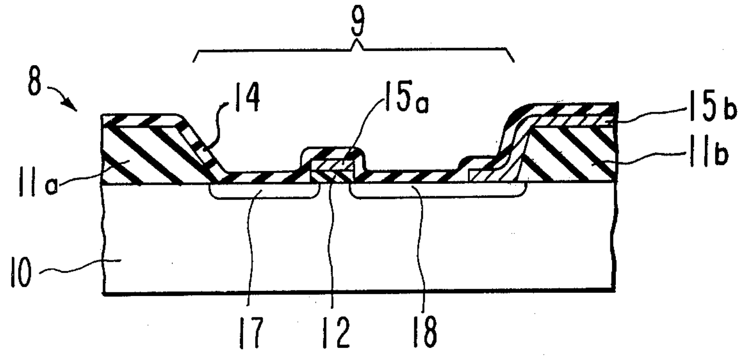
FIGS. 1_a_ through 1_d_ show the improved process for fabricating MOS circuits.

(i.e. material 11*a* and 11*b*) is formed upon the surface of substrate 10 of wafer 8. In one embodiment, substrate 10 is N conductivity type monocrystalline silicon, while insulating material 11 is silicon dioxide. Insulating material 11 is removed from the surface of substrate 10 within a region 9. Typically, this is accomplished by an etching process; however, other processes may also be employed. A region of insulating material 12 is then formed on substrate 10 throughout region 9, and may also be formed on insulating material 11. This material typically will be silicon dioxide and will be thinner than insulating material 11; however, other non-electrically-conductive materials of appropriate thickness may also be employed. Subsequently, a region of electrically conductive material 15 is formed on the surface of thin insulating material 12. To provide for electrical contact to other regions, a region of conductive material 15 may also be formed elsewhere on the surface of wafer 8, for example, on insulating material 11*b*, substrate 10, and region 18. In one embodiment of the process of this invention, electrically conductive material 15*a* and 15*b* is formed by depositing a layer of material 15 across the surface of insulating materials 11 and 12, and then removing conductive material 15 from all portions of insulating materials 11 and 12, except at those selected regions where the material is desired, for example, as shown in FIG. 1*a*. Conductive material 15 typically will be polycrystalline silicon, also known as polysilicon, although other electrical conductive materials may be also employed. Those regions of insulating material 12 not covered by patterned layer 15 are removed.

A region of first selected material 14 is then formed across the surface of wafer 8. In one embodiment of this invention, the first selected material is boron oxide. The boron from the oxide will diffuse into the surface of substrate 10 to form regions 17 and 18. In general, the first selected material may be any insulating material which contains dopant for the source and drain regions.

Figure 1B:
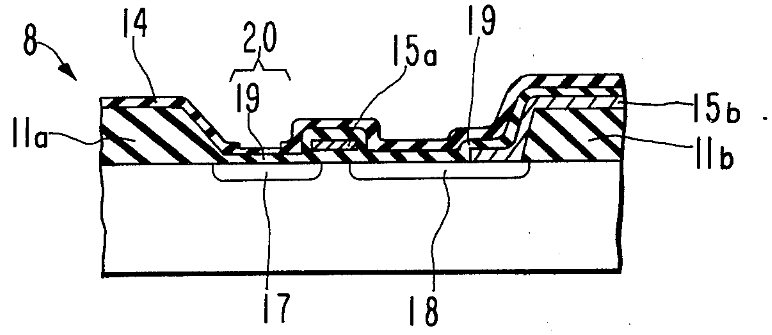

Referring now to FIG. 1*b*, all or selected portions of first selected material 14 are removed from substrate 10, for example at region 20. This removal will typically be accomplished by an etching process; however, other procedures may also be used. It should be noted that unlike the fabrication processes of the prior art, it is not necessary to remove all of the first selected material 14 from regions where electrical contact is desired. Any small amount remaining will be removed in a later step of the fabrication process. (FIG. 1*b* shows a small amount remaining.) After removal of the selected region of first selected material 14, a layer of first insulating material 19 is formed on the surface of the underlying material, for example, insulating material 11, regions 17 and 18, and conductive material 15. First insulating material 19 typically will be silicon dioxide formed by an oxidation process, however, other materials may also be used. In carrying out this step, oxygen atoms easily pass through any remaining material 14 to combine with semiconductor material 10 and thus form an oxide.

Figure 1C:
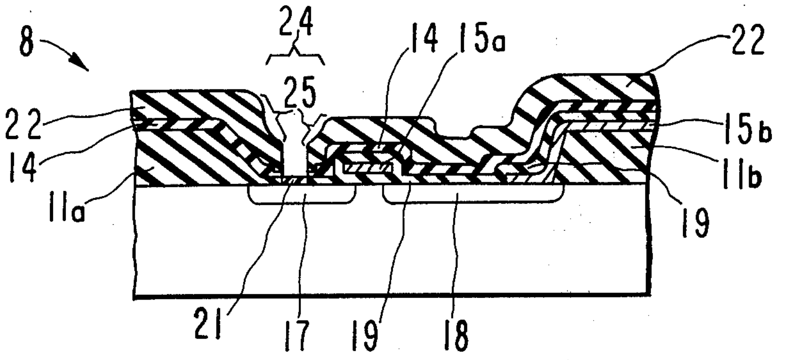

Referring now to FIG. 1*c*, a layer of second insulating material 22 is formed on the surface of the wafer 8. The second insulating material 22 may be the same as the first insulating material 19; however, material 22 will have "flow" properties at elevated temperatures. Thus, elevated temperatures will soften the second insulating material 22 so that it will flow like viscous liquid. After its formation, the second insulating material 22 is subjected to elevated temperatures (a heat treatment) which causes smoothing of non-uniformities. Openings 24 for electrical connections to underlying material are then made, and the second insulating material 22 is again subjected to elevated temperatures. This heat treatment causes smoothing of the edges 25 of the openings for electrical connections, which in prior art processes remain sharp. It should be noted that region 20 (FIG. 1*b*) and region 24 (FIG. 1*c*) need not be the same size. For example, for purposes of alignment ease it may be convenient for region 24 to be disposed entirely within region 20.

During the second heat treatment of the second insulating material 22, a relatively thin region of insulating material 21, typically a boron oxide, is formed in the contact opening, for example, on the surface of region 17.

Figure 1D:
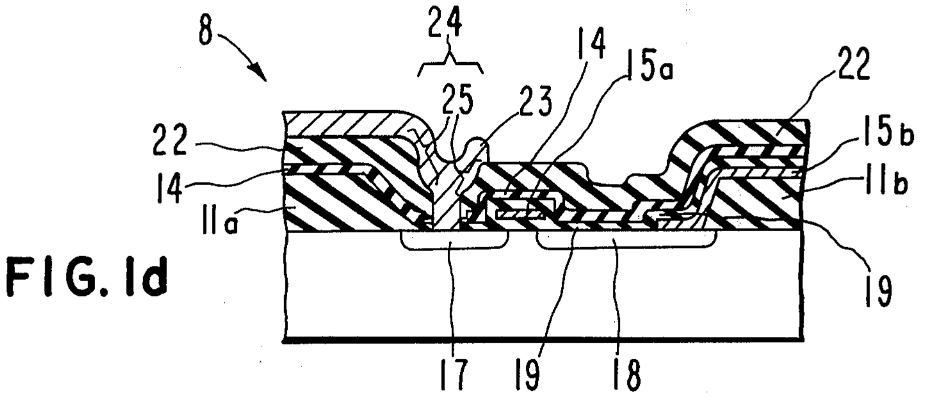

Newly formed insulating material 21 is then converted to second selected material 21. For example, in one embodiment if the first selected material 14 is an oxide of boron, and the second selected material 21 is to be predominately an oxide of phosphorous, a $POCl_3$ treatment well-known in semiconductor manufacture could be performed to convert the boron oxide to predominantely phosphorous oxide. During this $POCl_3$ treatment the surface of the source or drain regions 17 and 18 and the polycrystalline silicon gate are converted to lightly doped N- conductivity type material. Referring now to FIG. 1*d*, the relatively thin region of second selected material 21 is removed by any desired process, for example, an etch. Electrical connections 23 may then be formed for providing electrical signals to wafer 8.

Second selected material 21 must be a material whose chemical properties are sufficiently different relative to the initially formed insulating materials and other materials on the substrate that it can be selectively removed without significantly affecting surrounding materials. For example, second selected material may be fast etching compared to other materials in the structure.

Further, it may be desirable for the second selected material to contain dopant of opposite conductivity type to the first selected material. For example, in one embodiment, the coversion of the first selected material in region 24 to second selected material may cause the source region and drain region to be doped N conductivity type to a very shallow depth. This causes the surface of the source region and drain region to become hydrophobic when clean, thereby furnishing visible indicator of when the etching process is complete. The N type surface layer causes no adverse effects as it is sufficiently shallow to allow electrical contact to the p+ regions to be made by alloying through the surface layer.

The above described invention provides numerous advantages over existing prior art. The edges 25 of the openings for electrical connections in region 24 will be smoothly contoured because of the heat treatment of insulating material 22. This eliminates the need for achieving the contour during an etching process as in the prior art. Further, the size of the openings for electrical contact are also controlled with more precision than in the prior art. This is accomplished by the conversion of first selected material to second selected material. For example, in one embodiment, any remaining portion of first selected material 14 (see FIG. 1*b*) plus additional insulating material which is formed beneath the first selected material is converted to a predominantly phosphorous oxide layer by means of a phosphorous diffusion, well-known in semiconductor manufacturing. This thin layer of predominantly phosphorous oxide may be then removed without additional masking step. This is possible because its etch rate is sufficiently great so only a minor amount of insulating material 22 surrounding the electrical contact openings is removed. This loss of insulating material 22 can be compensated for by forming insulating material 22 slightly thicker than that desired in the final structure.

What is claimed is:

1. The method of manufacturing an MOS device comprising the steps of:

forming a first layer of insulating material on a selected surface of a substrate of semiconductor material;

removing a portion of said first layer of insulating material from a selected region on the surface of said substrate;

forming a second layer of insulating material within said selected region;

forming electrically conductive material in selected patterns over the top surfaces of said first layer of insulating material and said second layer of insulating material thereby to leave exposed selected portions of said second layer of insulating material;

removing said selected portions of said second layer of insulating material to thereby expose the top surfaces of the regions of said semiconductor material underlying said selected portions;

forming a layer of first selected material on the top surfaces of said regions of semiconductor material, said conductive material and said first layer of insulating material, said first selected material containing a dopant for the formation of source and drain regions in said regions of said semiconductor material;

forming source and drain regions in said semiconductor material by diffusing the dopant from said first selected material into said regions of said semiconductor material;

removing selected portions of said first selected material from said top surfaces of said regions of said semiconductor material;

forming a third layer of insulating material on the surface of said semiconductor material and said first layer of insulating material, said third layer of insulating material being formed beneath the remaining portions of said first selected material;

forming a fourth layer of insulating material over the exposed top surfaces of the remaining portions of said first selected material;

forming openings for electrical connections through said fourth layer of insulating material to expose selected portions of the top surfaces of said source and drain regions;

heating said substrate and the attached materials to smooth the edges of said openings thereby to prevent electrical connections which will cross said edges from cracking, and simultaneously to form a relatively thin region of an oxide of the dopant used to form said source and drain regions on the exposed selected portions of the top surfaces of said source and drain regions;

converting said oxide of the dopant to a second selected material while simultaneously converting shallow surface layers of said source and drain regions to lightly-doped material of opposite conductivity type to the conductivity type of said source and drain regions, said lightly-doped material possessing an etch rate relatively higher than the etch rate of the insulating material remaining on said substrate; and, removing said second selected material from the surfaces of said source and drain regions exposed by said openings thereby to allow electrical contact to be made to said source and drain regions.

2. The method of claim 1 including between the steps of forming a fourth layer of insulating material and forming openings for electrical connections, the step of heating said substrate and the attached materials to smooth out nonuniformities in selected ones of said attached materials.

3. The method of claim 1 wherein said shallow surface layers of said source and drain regions are hydrophobic, thereby furnishing a visible indicator of when the second selected material overlying said source and drain regions has been completely removed.

4. The method of claim 1 wherein said source and drain regions are of P-type conductivity and said second selected material is of an N-type conductivity.

5. The method of claim 4 wherein boron is the P-type dopant used to give said source and drain regions a P-type conductivity and phosphorus is the N-type dopant used to convert the shallow surface layers of said source and drain regions to N-type conductivity.

6. In the fabrication of a field effect semiconductor device wherein an insulation layer is established on the surface of a body of semiconductor material, and wherein source and drain regions are formed in said body of semiconductor material adjacacent said surface, said source and drain regions being separated by a channel on which is formed gate insulation and a conductive gate electrode, the improvement comprising:

forming said source and drain regions by diffusing a dopant from a layer of the oxide of said dopant formed over the surfaces of said source and drain regions;

forming an oxide of said semiconductor material at least over those portions of the surfaces of said source and drain regions underlying said oxide of said dopant by passing oxygen atoms through said oxide of said dopant;

forming a second layer of insulating material on the surface of said oxide of said dopant;

forming openings for electrical connections through said second layer of insulating material to expose portions of the top surfaces of said source and drain regions;

heat treating said wafer to smooth the edges of the openings in said second layer of insulating material thereby to prevent electrical connections to said source and drain regions from cracking at said edges and simultaneously forming a layer of the oxide of the dopant in said source and drain regions on at least the exposed surfaces of said source and drain regions.

converting said newly formed layer of the oxide of the dopant in said source and drain regions to a second selected material possessing a relatively faster etch rate than said insulation layer and second layer of insulating material; and, removing the second selected material from the openings thereby to allow electrical contacts to be made to said source and drain regions.

7. The method of claim 6 wherein said dopant in said source and drain regions comprises boron.

8. The method of claim 6 wherein said second selected material comprises an oxide of phosphorous.

9. The method of claim 8 wherein during the conversion of said newly formed layer of the oxide of the dopant in said source and drain regions to said oxide of phosphorous, a shallow layer of N-type conductivity material is formed on the surfaces of said source and drain regions and the conductive gate electrode of said device.

10. The method of claim 6 wherein the surface of the source and drain regions is hydrophobic when said second selected material is removed thereby providing a visible indicator of when the removal of said second selected material is completed.

11. In the fabrication in a body of semiconductor material possessing insulation on one surface thereof, of a field effect device containing a source region separated from a drain region by a channel regions overlain by gate insulation on which lies a gate electrode together with electrical contacts to the source and drain regions, the improvement in forming the openings in said insulation for said contacts to said source and drain regions, comprising:

forming openings for electrical connections through said insulation to expose selected portions of the top surfaces of said source and drain regions;

heating said semiconductor material to smooth the edges of said openings thereby to prevent electrical contacts which will cross said edges from cracking, and simultaneously to form a relatively thin region of an oxide of the dopant used to form said source and drain regions on the exposed selected portions of the top surfaces of said source and drain regions;

converting said oxide of the dopant to a second selected material while simultaneously converting shallow surface layers of said source and drain regions to lightly-doped material of opposite conductivity type to the conductivity type of said source and drain regions, said lightly-doped material possessing an etch rate relatively higher than the etch rate of said insulation; and, removing said second selected material from the surfaces of said source and drain regions exposed by said openings thereby to allow electrical contact to be made to said source and drain regions.

* * * * *

UNITED STATES PATENT OFFICE
CERTIFICATE OF CORRECTION

PATENT NO. : 3,912,558

DATED : May 3, 1974

INVENTOR(S) : Robert L. Luce, Joseph P. Perry and James D. Sansburry

It is certified that error appears in the above-identified patent and that said Letters Patent are hereby corrected as shown below:

Change name of inventor to read ROBERT L. LUCE, JOSEPH P. PERRY and JAMES D. SANSBURY

Signed and Sealed this

Twenty-third Day of November 1976

[SEAL]

*Attest:*

RUTH C. MASON
*Attesting Officer*

C. MARSHALL DANN
*Commissioner of Patents and Trademarks*